United States Patent
Weng

(10) Patent No.: US 7,524,682 B2
(45) Date of Patent: Apr. 28, 2009

(54) METHOD FOR MONITORING TEMPERATURE IN THERMAL PROCESS

(75) Inventor: Chen-Liang Weng, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/309,060

(22) Filed: Jun. 15, 2006

(65) Prior Publication Data

US 2007/0292977 A1    Dec. 20, 2007

(51) Int. Cl.
*H01L 21/66* (2006.01)
*H01L 21/336* (2006.01)
*H01L 21/44* (2006.01)

(52) U.S. Cl. .................. 438/14; 438/17; 438/305; 438/655

(58) Field of Classification Search ............ 438/10, 438/14, 17, 486, 795, 549, 558, 649, 655, 438/682; 257/2, 17, 52, 70; 374/141, 183, 374/185
See application file for complete search history.

(56) References Cited

U.S. PATENT DOCUMENTS

| | | | | |
|---|---|---|---|---|
| 6,033,922 A | * | 3/2000 | Rowland et al. | 438/14 |
| 6,065,869 A | * | 5/2000 | Lin et al. | 374/183 |
| 6,258,681 B1 | * | 7/2001 | Fulford et al. | 438/305 |
| 6,461,923 B1 | * | 10/2002 | Hui et al. | 438/305 |
| 6,635,501 B1 | * | 10/2003 | Rowland | 438/14 |
| 2006/0138357 A1 | * | 6/2006 | Kim | 250/492.21 |

* cited by examiner

*Primary Examiner*—Chuong A. Luu
(74) *Attorney, Agent, or Firm*—Jianq Chyun IP Office

(57) ABSTRACT

A method for monitoring a temperature in a thermal process is described. A monitor substrate is provided and subject to ion implantation, and a characteristic parameter of the monitor substrate correlated to the disorder degree of the lattice structure of the same is measured to obtain a first value. The monitor substrate is then subject to the thermal process, and the characteristic parameter of the monitor substrate is measured again to obtain a second value. The difference between the first value and the second value is calculated to derive the temperature in the thermal process.

20 Claims, 1 Drawing Sheet

METHOD FOR MONITORING TEMPERATURE IN THERMAL PROCESS

BACKGROUND OF THE INVENTION

1. Field of the Invention

The present invention relates to a semiconductor process. More particularly, the present invention relates to a method for monitoring a temperature in a thermal process, especially a low-temperature thermal process.

2. Description of the Related Art

In a semiconductor fabricating process, the properties of certain parts of the devices are relatively sensitive to the temperatures in their respective forming processes, so that temperature monitor is a very important issue in those forming processes. For example, the sheet resistance of self-aligned silicide (salicide), especially nickel salicide or cobalt salicide, is very sensitive to the temperature in the thermal process for reacting the metal layer with the Si-substrate. Since the sheet resistance of the salicide layer greatly affects the device function, the temperature in the thermal silicidation process has to be monitored and controlled carefully.

For example, in a conventional cobalt salicide process, the temperature in the low-temperature thermal process for silicidation is monitored with the following steps. A cobalt layer is formed on a monitor wafer before the process, and then the monitor wafer is subject to the thermal process, together with the work wafers for forming devices, to form a cobalt silicide layer thereon. The sheet resistance of the cobalt silicide layer is measured to derive the temperature in the thermal silicidation process based on a standard temperature-sheet resistance calibration curve made previously.

However, since the monitor wafer has a cobalt silicide layer thereon after the above monitor process, it is difficult to recycle to save the production cost. Moreover, the sensitivity of the sheet resistance of cobalt silicide to the temperature in the thermal process is low in the temperature range adopted in practice, and the sheet resistance varies with the thickness of the deposited cobalt layer. Therefore, the real temperature cannot be determined precisely based on the sheet resistance. Furthermore, since the cobalt silicide is formed as a whole on the monitor wafer, local sheet resistance values cannot be determined to check the temperature uniformity in the thermal process tool.

SUMMARY OF THE INVENTION

In view of the foregoing, this invention provides a method for monitoring a temperature in a thermal process, especially a low-temperature thermal process like a thermal silicidation process of a salicide process.

The method for monitoring a temperature in a thermal process of this invention is described below. A monitor substrate is provided and subject to ion implantation, and a characteristic parameter of the monitor substrate correlated to the disorder degree of the lattice structure of the same, such as a thermal wave intensity of the same in a thermal wave analysis, is measured to obtain a first value. The monitor substrate is then subject to the thermal process, and the same characteristic parameter of the monitor substrate is measured again to obtain a second value. The difference between the first and the second values is calculated to derive the temperature in the thermal process.

When the monitor substrate is reactive to other material in the thermal process, an isolating layer can be formed on the monitor substrate before the ion implantation. For example, in an embodiment where the thermal process is an annealing process of a salicide process for silicidation, an isolating layer is required to prevent the metal layer from reacting with the monitor substrate in the thermal process. The metal layer is deposited after the first value is measured but before the thermal process, and removed after the thermal process but before the second value is measured.

Since the change in disorder degree of the lattice structure of a monitor substrate is sensitive to a temperature within a certain range suitable for silicidation, the invention is particularly useful in monitoring/controlling the temperature in an annealing process of a salicide process. Hence, the sheet resistance of the metal silicide can be controlled more precisely. Based on the same principle, this invention is not restricted to monitor an annealing process of a salicide process, but can be readily applied to any other kind of low-temperature thermal process conducted at a temperature within a certain range to which the change in disorder degree of the lattice structure of the substrate is sensitive.

Moreover, when the invention is applied to salicide process, the following merits are noted. Since no metal silicide is formed on the monitor substrate as a monitor wafer, the monitor wafer can be easily recovered with high-temperature annealing and used again. Moreover, for the disorder degree of the lattice structure of the monitor substrate is not affected by the thickness of the metal layer, the temperature is determined more precisely. In addition, because the lattice disorder of the monitor substrate can be investigated locally with, for example, a thermal wave analysis, the temperature uniformity in the thermal process tool can be checked.

It is to be understood that both the foregoing general description and the following detailed description are exemplary, and are intended to provide further explanation of the invention as claimed.

DESCRIPTION OF THE PREFERRED EMBODIMENTS

Figure 1:
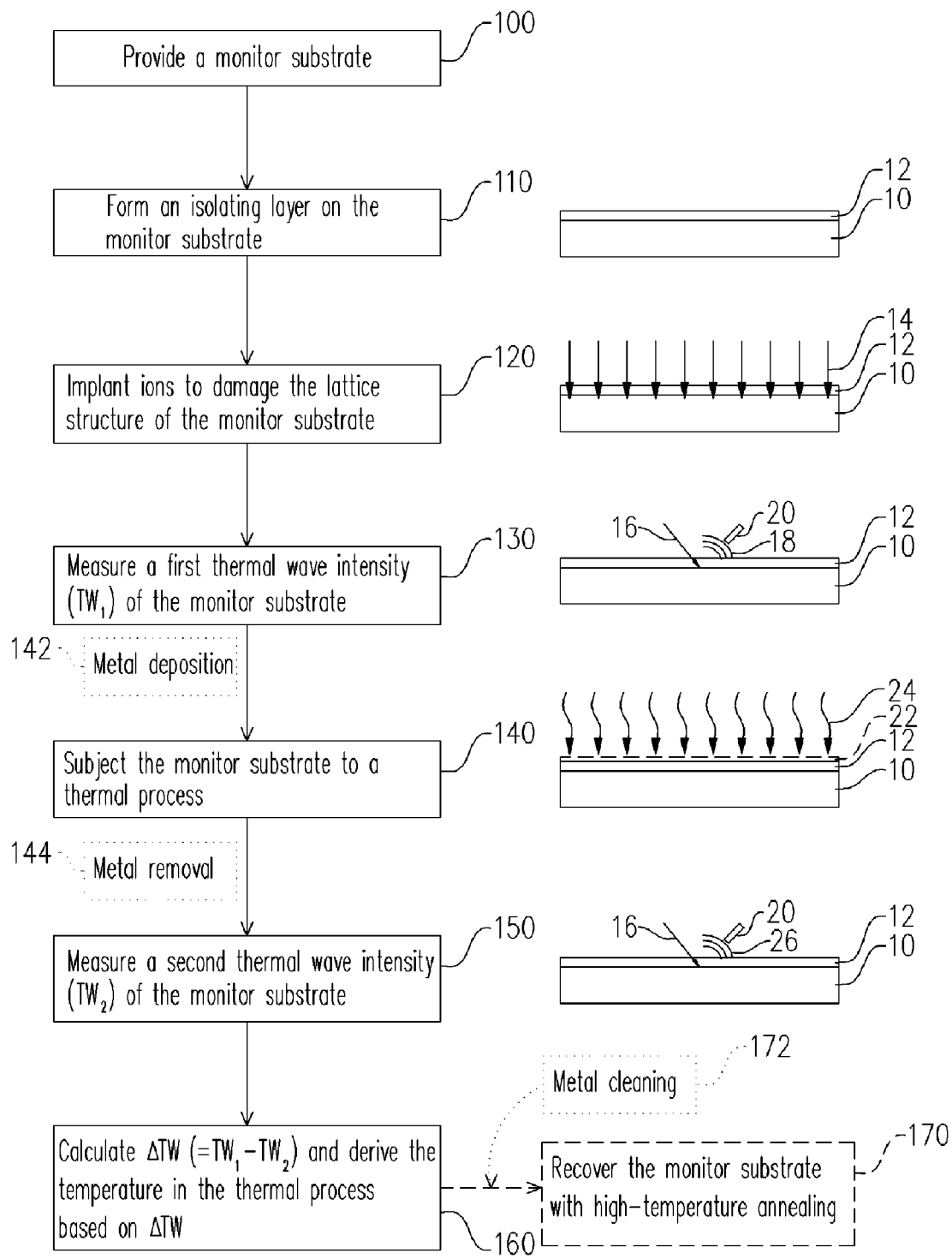
FIG. 1 illustrates a process flow of a method for monitoring a temperature in a thermal process according to a preferred embodiment of this invention.

In the preferred embodiment of this invention, the characteristic parameter of the monitor substrate used to derive the temperature is a thermal wave intensity, which is an ideal parameter for its change is linearly correlated with the temperature in the thermal process as the processing time is fixed. Nevertheless, other parameter that can indicate the lattice disorder degree, such as light reflectivity or X-ray scattering intensity, can also be used together with a standard temperature-parameter curve made previously to derive the temperature, even if its change is not linearly correlated to the temperature.

Referring to FIG. 1, a monitor substrate 10 that has the same material as a work substrate for forming devices is provided (step 100). The monitor substrate 10 may be a wafer or a portion of a wafer no for forming device. In the latter case, the wafer also has another portion as a work substrate for forming devices, and the monitor substrate 10 may be located in a scribe line region of the wafer with the work substrate being the die regions of the wafer. Such a design can greatly save the monitor cost. Moreover, the monitor substrate 10 may includes silicon, and the wafer may be a silicon wafer.

Since in many cases the monitor substrate 10 is reactive to other material in the thermal process monitored, an isolating layer 12 is preferably formed on the monitor substrate 10 (step 110). The isolating layer 12 may include a dielectric material like silicon oxide (SiO) or silicon nitride (SiN), and may be formed in a known vertical-type atmospheric pressure chemical vapor deposition (APCVD) furnace. The thickness of the isolating layer 12 as a SiO layer may be 100-500 Å, preferably about 175-185 Å, to suppress the preparation noise of the monitor wafer. Such an isolating layer 12 can effectively prevent a silicon monitor substrate from being reacted with a metal layer deposited thereon, as described later.

Thereafter, in step 120, ion implantation 14 is conducted to the monitor substrate 10 to damage the lattice structure of a surface layer of the substrate 10, i.e., to increase the disorder degree of the lattice structure. The ion implantation 14 can penetrate the isolating layer 12 in the cases where an isolating layer 12 is formed, and may use a heavier ion like arsenic (As) ion, gallium (Ga) ion or germanium (Ge) ion, wherein the arsenic ion is preferred when the monitor substrate 10 includes silicon.

In addition, the concentration of the dopant from the ion implantation 14 in the monitor substrate 10 is preferably much lower than the solid-state solubility of the same dopant in the substrate material, because the change in thermal wave intensity is difficult to detect when the surface layer of the monitor substrate 10 is saturated with the dopant. For example, when arsenic ion is used in the ion implantation 14, the implantation dose is preferably set in the order of $10^{14}/cm^2$, which is much lower than the saturation dose in the order of $10^{15}/cm^2$, and the energy may be set at about 120 KeV.

In next step 130, a first thermal wave intensity ($TW_1$) of the monitor substrate 10 is measured. The thermal wave analysis tool essentially includes a laser 16 passing the isolating layer 12 and heating a region of the monitor substrate 10 to produce a thermal wave 18, and a detector 20 for detecting the thermal wave 18.

Then, the monitor substrate 10 is subject to a target thermal process 24 together with a work substrate for forming devices (step 140). The range of the temperature of the thermal process 24 preferably monitored with this method is about 480-600° C. When the thermal process 24 monitored is an annealing process of a salicide process, a metal layer 22 is deposited on the isolating layer 12 (step 142) before the annealing process, so as to make a closed-loop temperature control with the thermal wave (TW) monitor method for a pyrometer. The metal layer 22 is deposited on the monitor substrate 10 and the work substrate simultaneously when the two are on the same wafer, and may include only one metal element like cobalt (Co), nickel (Ni) or titanium (Ti), a metal alloy like a Co—Ti alloy, or a composite layer like a Co/Ti, Co/TiN or Co/Ti/TiN composite layer for forming cobalt silicide. In addition, the annealing process of the salicide process may be a rapid thermal annealing (RTA) process.

In the annealing process of the salicide process, the metal layer 22 will react with the silicon material on the work substrate, but not with the silicon material on the monitor substrate 10 due to the isolation of the isolating layer 12. When the metal layer 22 is based on cobalt, for example, the temperature in the annealing process for forming cobalt silicide is usually set at 500-550° C. After the above annealing process, the metal layer 22 has to be removed (step 140), possibly with a $H_2SO_4/H_2O_2$ mixture.

In next step 150, a second thermal wave intensity ($TW_2$) of the monitor substrate 10 is measured. Similarly, the laser 16 passes the isolating layer 12 and heats a region of the monitor substrate 10 to produce a thermal wave 26, which is detected by the detector 20 to obtain $TW_2$.

Then, the differential thermal wave intensity ($\Delta TW=TW_1-TW_2$) is calculated (step 160). It is noted that $TW_1$ is always larger than $TW_2$, and $\Delta TW$ increases with the increase of the temperature in the thermal process 24 because a higher temperature causes more lattice relaxation in a constant processing period. The temperature in the thermal process 24 is then derive based on $\Delta TW$, possibly using a standard temperature—$\Delta TW$ calibration curve that is made previously with experiments conducted at a series of carefully calibrated temperatures.

If the monitor substrate 10 as a monitor wafer is to be recycled for saving the monitor cost, it can be recovered with high-temperature annealing (step 170), preferably at a temperature higher than 1000° C., to drive the dopant far away from the surface layer thereof and completely restore the lattice structure of the surface layer. In an example, the monitor substrate 10 is annealed at 1150° C. in an $N_2$-atmosphere. Moreover, in the cases where a metal layer 22 had ever been formed on the isolating layer 12 and then removed, it is preferred to complete clean away the residue of the metal layer 22 before the high-temperature annealing to prevent metal contamination (step 172).

According to the above embodiments of this invention, because the change in thermal wave intensity of a monitor substrate is sensitive to the temperature in a certain range suitable for silicidation, the above method is particularly useful in monitoring/controlling the temperature in the annealing process of a salicide process. Thereby, the sheet resistance of the metal salicide layer can be controlled better. Moreover, since no salicide is formed on the monitor substrate as a monitor wafer, the monitor wafer can be easily recovered with high-temperature annealing and used again. In addition, because the thermal wave analysis can determine local lattice-disorder degree of the monitor substrate, the temperature uniformity in the thermal process tool can be checked easily.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for monitoring a temperature in a thermal process, comprising:
   providing a monitor substrate;
   conducting ion implantation to the monitor substrate;
   measuring a characteristic parameter of the monitor substrate correlated to a disorder degree of a lattice structure of the monitor substrate to obtain a first value;
   subjecting the monitor substrate to the thermal process;
   measuring the characteristic parameter of the monitor substrate again to obtain a second value; and
   calculating a difference between the first value and the second value to derive the temperature in the thermal process.

2. The method of claim 1, wherein the temperature monitored is within a range of 480-600° C.

3. The method of claim 1, wherein the difference between the first and the second values is substantially linearly correlated with the temperature in the thermal process.

4. The method of claim 3, wherein the characteristic parameter is a thermal wave intensity of the monitor substrate in a thermal wave analysis.

5. The method of claim 1, further comprising:
forming an isolating layer on the monitor substrate before the ion implantation to prevent a reaction of the monitor substrate in the subsequent thermal process.

6. The method of claim 1, further comprising:
subjecting the monitor substrate to a high-temperature annealing step capable of recovering the lattice structure of the monitor substrate for repeated use.

7. The method of claim 1, wherein the thermal process comprises an annealing process of a self-aligned silicide (salicide) process, further comprising:
forming an isolating layer on the monitor substrate before the ion implantation;
depositing a metal layer on the isolating layer after the first value is measured but before the thermal process is conducted; and
removing the metal layer after the thermal process is conducted but before the second value is measured.

8. The method of claim 7, further comprising:
completely cleaning away a residue of the metal layer; and
subjecting the monitor substrate to a high-temperature annealing step capable of recovering the lattice structure of the monitor substrate for repeated use.

9. The method of claim 7, wherein the metal layer comprises Co, Ni or Ti.

10. The method of claim 7, wherein the isolating layer comprises SiO or SiN.

11. The method of claim 1, wherein the monitor substrate is a portion of a wafer not for forming devices, and the wafer includes another portion as a work substrate for forming devices.

12. The method of claim 11, wherein the monitor substrate is located in a scribe line region of the wafer.

13. A method for monitoring a temperature in a thermal process of a self-aligned silicide (salicide) process, comprising:
providing a silicon monitor substrate;
forming an isolating layer on the silicon monitor substrate;
conducting ion implantation to the silicon monitor substrate;
measuring a first thermal wave intensity of the silicon monitor substrate;
forming a metal layer on the isolating layer;
subjecting the silicon monitor substrate to the thermal process;
removing the metal layer;
measuring a second thermal wave intensity of the silicon monitor substrate; and
calculating a difference between the first and the second thermal wave intensities to derive the temperature in the thermal process.

14. The method of claim 13, wherein the thermal process comprises a rapid thermal annealing (RTA) process.

15. The method of claim 13, wherein the metal layer comprises Co, Ni or Ti.

16. The method of claim 13, wherein the isolating layer comprises SiO or SiN.

17. The method of claim 13, wherein arsenic ion is used in the ion implantation.

18. The method of claim 13, further comprising:
completely cleaning away a residue of the metal layer; and
subjecting the silicon monitor substrate to a high-temperature annealing step that recovers a lattice structure of the silicon monitor substrate for repeated use.

19. The method of claim 13, wherein the silicon monitor substrate is a portion of a silicon wafer not for forming devices, and the silicon wafer includes another portion as a work substrate for forming devices.

20. The method of claim 19, wherein the silicon monitor substrate is located in a scribe line region of the silicon wafer.

* * * * *